United States Patent
Freidl et al.

(10) Patent No.: US 12,114,472 B2
(45) Date of Patent: Oct. 8, 2024

(54) RF COMPONENT AND METHOD

(71) Applicant: NXP B.V., Eindhoven (NL)

(72) Inventors: Philipp Franz Freidl, Weurt (NL); Mustafa Acar, Eindhoven (NL); Antonius Hendrikus Jozef Kamphuis, Nijmegen (NL); Jan Willem Bergman, Veghel (NL)

(73) Assignee: NXP B.V., Eindhoven (NL)

( * ) Notice: Subject to any disclaimer, the term of this patent is extended or adjusted under 35 U.S.C. 154(b) by 109 days.

(21) Appl. No.: 18/059,611

(22) Filed: Nov. 29, 2022

(65) Prior Publication Data
US 2023/0189492 A1 Jun. 15, 2023

(30) Foreign Application Priority Data
Dec. 13, 2021 (EP) .................................. 21213985

(51) Int. Cl.
*H05K 9/00* (2006.01)
*H01P 3/08* (2006.01)
*H01Q 1/52* (2006.01)

(52) U.S. Cl.
CPC ............. *H05K 9/0081* (2013.01); *H01P 3/08* (2013.01); *H01Q 1/526* (2013.01); *H05K 9/0037* (2013.01)

(58) Field of Classification Search
CPC ..... H05K 9/0037; H01Q 1/526; H01Q 17/008
See application file for complete search history.

(56) References Cited

U.S. PATENT DOCUMENTS

| | | | | |
|---|---|---|---|---|
| 4,658,334 A | * | 4/1987 | McSparran | H05K 9/0039 174/262 |
| 5,150,088 A | | 9/1992 | Mrga et al. | |
| 5,384,555 A | | 1/1995 | Wilson et al. | |
| 6,157,546 A | * | 12/2000 | Petty | H05K 9/0035 361/753 |
| 6,974,724 B2 | | 12/2005 | Hyvoenen et al. | |

(Continued)

FOREIGN PATENT DOCUMENTS

| | | |
|---|---|---|
| CN | 101036262 B | 12/2015 |
| CN | 113013642 A | 6/2021 |

OTHER PUBLICATIONS

Elwi, T., "Printed Microwave Metamaterial-Antenna Circuitries on Nickel Oxide Polymerized Palm Fiber Substrates", Scientific Reports, Article No. 2174, Feb. 18, 2019.

*Primary Examiner* — Hung V Ngo

(57) ABSTRACT

A Radio Frequency, "RF", component and a method of making the same. The component includes a first electrically conductive signal member for conveying an RF signal and a second electrically conductive signal member for conveying an RF signal. The component also includes a barrier located between the first signal member and the second signal member electromagnetically to shield the first and second signal members from each other. The barrier includes a first row of electrically conductive shielding members spaced apart along a longitudinal axis of the first row, and a second row of electrically conductive shielding members spaced apart along a longitudinal axis of the second row. Each shielding member includes a polyhedron. The shielding members of the first row are offset with respect to the shielding members of the second row to prevent a direct line of sight between the first signal member and the second signal member.

20 Claims, 4 Drawing Sheets

(56) References Cited

U.S. PATENT DOCUMENTS

| | | | |
|---|---|---|---|
| 7,352,328 B2 | 4/2008 | Moon et al. | |
| 7,637,776 B2 * | 12/2009 | McNutt | H01B 11/06 |
| | | | 439/607.05 |
| 9,788,466 B2 | 10/2017 | Chen | |
| 9,899,341 B2 | 2/2018 | Hashemi et al. | |
| 10,206,317 B2 * | 2/2019 | Liukkonen | H05K 9/0024 |
| 10,464,306 B2 * | 11/2019 | MacDonald | B29C 64/118 |
| 10,608,345 B2 | 3/2020 | Kirino et al. | |
| 10,714,430 B2 | 7/2020 | Murtuza et al. | |
| 2005/0245001 A1 | 11/2005 | Hyvonen et al. | |
| 2009/0091507 A1 | 4/2009 | Chung et al. | |
| 2013/0050031 A1 | 2/2013 | Zhu et al. | |
| 2015/0327357 A1 * | 11/2015 | Khan | H01P 3/084 |
| | | | 333/243 |
| 2018/0277489 A1 * | 9/2018 | Han | H01L 24/13 |
| 2020/0176884 A1 | 6/2020 | Kirino et al. | |
| 2020/0185802 A1 | 6/2020 | Vilenskiy et al. | |

* cited by examiner

RF COMPONENT AND METHOD

CROSS-REFERENCE TO RELATED APPLICATIONS

This application claims the priority under 35 U.S.C. § 119 of European Patent application no. 21213985.1, filed on 13 Dec. 2021, the contents of which are incorporated by reference herein.

BACKGROUND

The present specification relates to a Radio Frequency (RF) component and a method of making an RF component.

In many RF components, it is necessary to provide electromagnetic shielding between two elements, such as transmission lines or antennae, so as to mitigate against electromagnetic interference between the two components.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a Radio Frequency, "RF", component comprising:
  a first electrically conductive signal member for conveying an RF signal;
  a second electrically conductive signal member for conveying an RF signal; and
  a barrier located between the first electrically conductive signal member and the second electrically conductive signal member electromagnetically to shield the first and second electrically conductive signal members from each other, wherein the barrier comprises:
    a first row of electrically conductive shielding members spaced apart along a longitudinal axis of the first row, wherein each electrically conductive shielding member in the first row comprises a polyhedron; and
    a second row of electrically conductive shielding members spaced apart along a longitudinal axis of the second row, wherein each electrically conductive shielding member in the second row comprises a polyhedron; and
  wherein the electrically conductive shielding members of the first row are offset with respect to the electrically conductive shielding members of the second row to prevent a direct line of sight between the first electrically conductive signal member and the second electrically conductive signal member.

According to another aspect of the present disclosure, there is provided a method of making a Radio Frequency, "RF", component, the method comprising forming:
  a first electrically conductive signal member for conveying an RF signal;
  a second electrically conductive signal member for conveying an RF signal; and
  a barrier located between the first electrically conductive signal member and the second electrically conductive signal member electromagnetically to shield the first and second electrically conductive signal members from each other, wherein the barrier comprises:
    a first row of electrically conductive shielding members spaced apart along a longitudinal axis of the first row, wherein each electrically conductive shielding member in the first row comprises a polyhedron; and
    a second row of electrically conductive shielding members spaced apart along a longitudinal axis of the second row, wherein each electrically conductive shielding member in the second row comprises a polyhedron; and
  wherein the electrically conductive shielding members of the first row are offset with respect to the electrically conductive shielding members of the second row to prevent a direct line of sight between the first electrically conductive signal member and the second electrically conductive signal member.

The provision of a barrier comprising rows of electrically conductive shielding members comprising polyhedra can provide greater design flexibility in customising the shape and configuration of the barrier for electromagnetically shielding the first and second electrically conductive signal members from each other. The use of polyhedra can also improve the electromagnetic isolation provided between the first and second electrically conductive signal members, particularly in combination with the offset provided between the first and second rows of electrically conductive shielding members.

Each electrically conductive shielding member in each row may be elongate. This can further improve the isolation provided between the first and second electrically conductive signal members. For instance, the long dimension of each electrically conductive shielding member may be made greater than the gaps located between each electrically conductive shielding member in each row.

A longitudinal axis of each polyhedron in each row may be substantially parallel to the longitudinal axis of that row. This can maximise the laterally facing profile of each electrically conductive shielding member in each row, again improving the isolation provided between the first and second electrically conductive signal members.

The longitudinal axis of the first row may be substantially parallel to the longitudinal axis of the second row.

Each electrically conductive shielding member in each row may be the same shape and size. This can make the shielding provided by the barrier more uniform along the length of the rows.

The electrically conductive shielding members of the first row may be offset with respect to the electrically conductive shielding members of the second row such that a gap located between each electrically conductive shielding member of the first row is located opposite a middle of an electrically conductive shielding member of the second row. This can improve the isolation provided between the first and second electrically conductive signal members by increasing the path length for electromagnetic fields attempting to pass through the barrier.

Each electrically conductive shielding member in each row may be a rectangular cuboid. This can simplify the manufacturing process.

The electrically conductive shielding members of the rows of the barrier may collectively form a labyrinthine structure. This can improve the isolation provided between the first and second electrically conductive signal members by increasing the path length for electromagnetic fields attempting to pass through the barrier and by requiring the fields to navigate multiple (e.g. at least three, four, five or even more) turns within the barrier.

Each electrically conductive shielding member of the first row may comprise:
  a base portion having a first end and a second end;

a first arm extending from the first end of the base towards the second row; and a second arm extending from the second end of the base towards the second row.

Each electrically conductive shielding member of the second row may comprise:

a base portion having a first end and a second end;

a first arm extending from the first end of the base towards the first row; and a second arm extending from the second end of the base towards the first row.

A distal end of each arm of each electrically conductive shielding member of the first row may be located within a region located between the arms of an electrically conductive shielding member of the second row. This can force electromagnetic fields attempting to pass through the barrier to navigate additional turns within the barrier.

A distal end of each arm of each electrically conductive shielding member of the second row may be located within a region located between the arms of an electrically conductive shielding member of the first row. This can force electromagnetic fields attempting to pass through the barrier to navigate additional turns within the barrier.

The barrier may comprise at least one further row of electrically conductive shielding members spaced apart along a longitudinal axis of that further row. Each electrically conductive shielding member in the or each further row may comprise a polyhedron.

The first electrically conductive signal member may comprise a transmission line.

The second electrically conductive signal member may comprise a transmission line.

The first electrically conductive signal member may comprise an antenna.

The second electrically conductive signal member may comprise an antenna.

According to a further aspect of the present disclosure, there is provided a semiconductor device comprising a package containing an RF component of the kind set out above.

For the purposes of the present disclosure, "Radio Frequency" (RF) refers to a frequency in the range 300 GHz≥f≥20 kHz.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
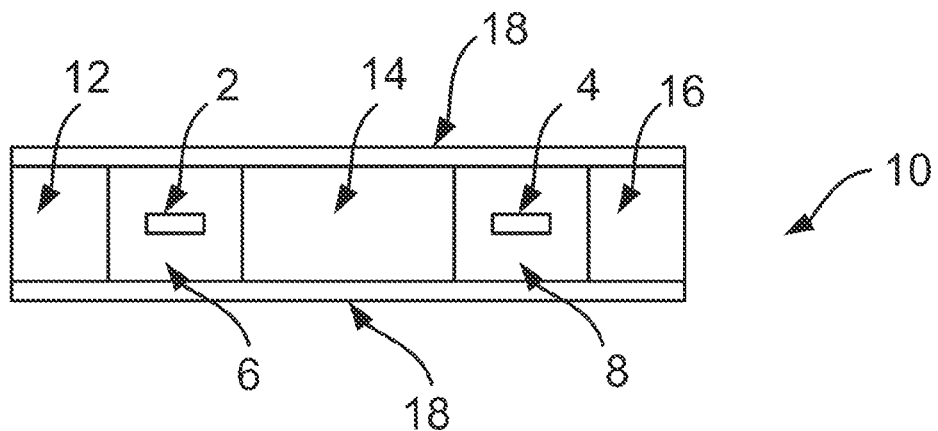
FIG. 1 shows an example of an RF component including two strip lines.
Figure 2:
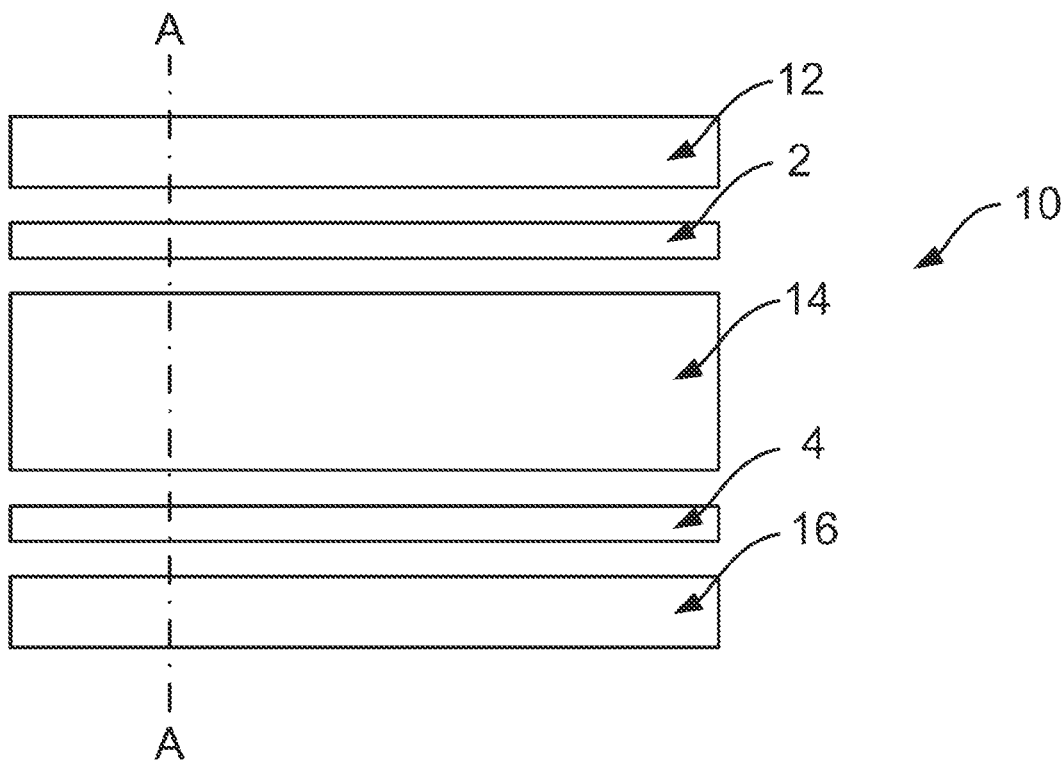
FIG. 2 shows another view of the RF component of FIG. 1.

FIGS. 1 and 2 show an example of an RF component 10 including a first electrically conductive signal member 2 for conveying an RF signal and a second electrically conductive signal member 4 for conveying an RF signal. FIG. 1 is a cross section of the RF component 10 through the longitudinal axes of the electrically conductive signal members 2, 4 (e.g. along the line A-A in FIG. 2) and FIG. 2 is a plan view of the RF component 10.

In this example, the first and second electrically conductive signal members 2, 4 are transmission lines e.g. strip lines. However, it will be appreciated that the electrically conductive signal members 2, 4 could be other kinds of components, such as antennae.

The first and second electrically conductive signal members 2, 4 may be provided in a laminated structure such as a metallization stack including a plurality of dielectric layers and layers of patterned metal features. Electrically conductive side walls 12, 16 may be provided at either lateral side of the RF component 10. Similarly, upper and lower electrically conductive walls 18 may be provided above and below the first and second electrically conductive signal members 2, 4. Each electrically conductive signal member 2, 4 may be located within a respective dielectric region 6, 8. The dielectric regions 6, 8 may be enclosed by the electrically conductive side walls 12, 16 and the upper and lower electrically conductive walls 18. The electrically conductive features, including the electrically conductive signal members 2, 4, the electrically conductive side walls 12, 16, the upper and lower electrically conductive walls 18 (and the barrier 14 to be described below) may be formed as the patterned metal features of the metallisation stack.

In order to provide electromagnetic shielding of the first electrically conductive signal member 2 from the second electrically conductive signal member 4 (and vice versa), the example shown in FIGS. 1 and 2 is provided with a barrier 14. The barrier 14 is electrically conductive (e.g. metallic) and is located between the first electrically conductive signal member 2 and the second electrically conductive signal member 4, and between the upper and lower electrically conductive walls 18.

As can be seen from FIG. 2, in this example, the side walls 12, 16, the first electrically conductive signal member 2, the second electrically conductive signal member 4 and the barrier 14 are elongate and coextend along a longitudinal axis of the RF component 10. As noted above, the first electrically conductive signal member 2 and the second electrically conductive signal member 4 in this example form strip lines. It will be appreciated that the elongate, coextensive arrangement shown in FIG. 2 is not essential, particularly, for example, where the electrically conductive signal members 2, 4 form RF components other than strip lines.

The barrier 14 in this example is formed by a monolithic metallic block. Similarly, the sidewalls 12, 16 in this example are also provided as monolithic blocks. The use of a barrier 14 comprising a monolithic block may be seen as the ideal case for the purposes of providing electromagnetic shielding between the first electrically conductive signal member 2 and the second electrically conductive signal member 4. However, the provision of a monolithic barrier 14 and side walls 12, 16 of the kind shown in FIGS. 1 and 2 is generally not possible, due to manufacturing constraints. For example, it is generally not possible to enclose the electrically conductive signal members 2, 4 completely within a monolithic wall, as there would be no way to allow the mold compound to evenly distribute during manufacture.

Figure 3:
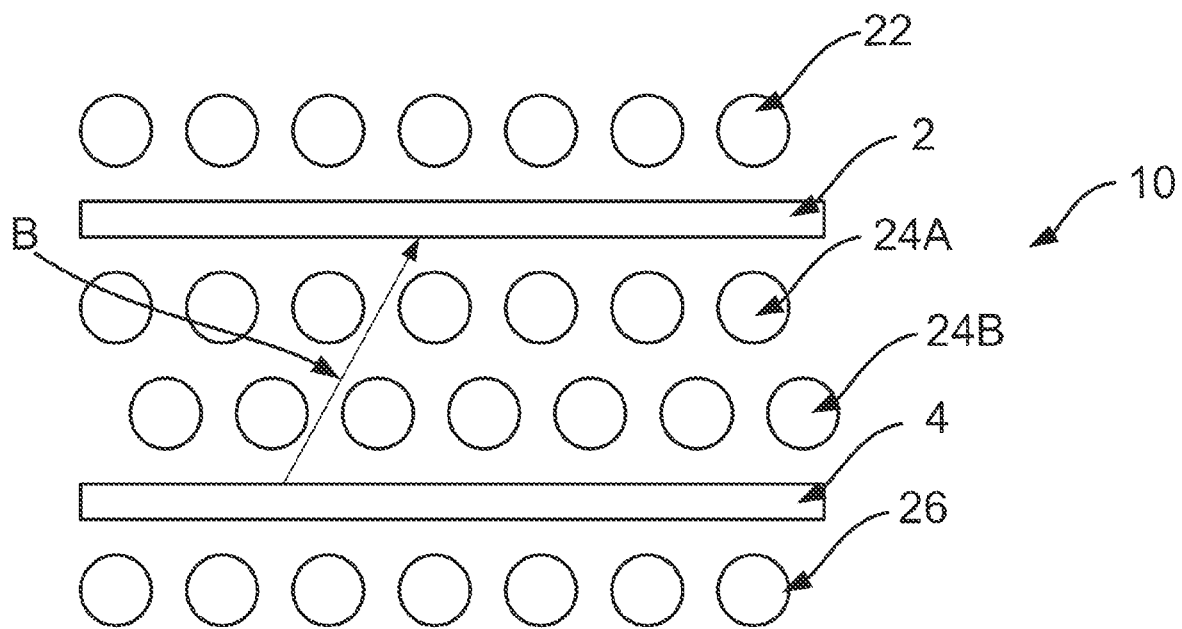
FIG. 3 shows another example of an RF component including two strip lines.

FIG. 3 shows another example of an RF component 10 including two strip lines 2, 4. The example shown in FIG. 3 uses linear rows of electrically conductive vias instead of monolithic blocks for the side walls and barrier described above in relation to FIGS. 1 and 2. In particular, a row of electrically conductive vias 22 forms the side wall 12, a row of electrically conductive vias 26 forms the side wall 16, and one or more rows of electrically conductive vias 24A, 24B form the barrier 14. The vias 24A, 24B may comprise vias filled with electrically conductive material (e.g. metal) located within a metallization stack. The example shown in FIG. 3 may also comprise upper and lower electrically conductive walls 18 of the kind shown in FIG. 1.

Although more feasible from a manufacturing perspective, the barrier in the example of FIG. 3 provides a lower degree of electromagnetic shielding than the monolithic barrier 14 shown in FIGS. 1 and 2. In particular, it will be appreciated that electromagnetic fields may extend through the gaps between the vias. To mitigate against this, where multiple rows of electrically conductive vias 24A, 24B are provided, the vias 24A may be offset (staggered) with respect to the vias 24B in another row (this is illustrated in FIG. 3), which may prevent there being a direct line of sight between the first electrically conductive signal member 2 and the second electrically conductive signal member 4 in a direction orthogonal to the longitudinal axes of the electrically conductive signal members 2, 4.

Although the example in FIG. 3 is practical to manufacture, certain constraints remain. For example, the size of the via wall may be restricted due to warpage, de-gas during curing and other production technology reasons.

Figure 4:
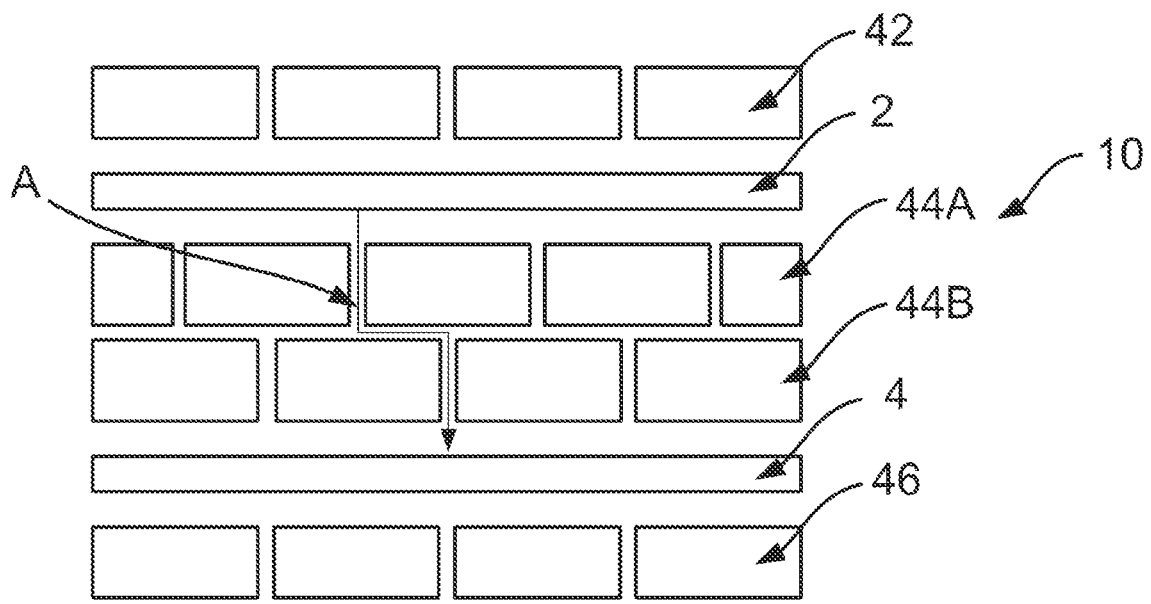
FIG. 4 shows an RF component including two strip lines, according to an embodiment of this disclosure.

FIG. 4 shows an RF component 10 according to an embodiment of this disclosure. In this embodiment, the RF component comprises a first electrically conductive signal member 2 for conveying an RF signal and a second electrically conductive signal member 4 for conveying an RF signal. In this embodiment, the first and second electrically conductive signal members 2, 4 are transmission lines e.g. strip lines. However, it will be appreciated that the electrically conductive signal members 2, 4 could be other kinds of components, such as antennae.

The first and second electrically conductive signal members 2, 4 may be provided in a laminated structure such as a metallization stack including a plurality of dielectric layers and layers of patterned metal features. The metallization stack may be located on a substrate such as a printed circuit board (PCB) or on a semiconductor substrate such as on the surface of a semiconductor die.

Electrically conductive side walls 42, 46 may be provided at either lateral side of the RF component 10. Similarly, upper and lower electrically conductive walls may be provided above and below the first and second electrically conductive signal members 2, 4, as described above in relation to FIG. 1. Each electrically conductive signal member 2, 4 may be located within a respective dielectric region as described above in relation to FIG. 1. The dielectric regions may be enclosed by the electrically conductive side walls 42, 46 and the upper and lower electrically conductive walls. The electrically conductive features, including the electrically conductive signal members 2, 4, the electrically conductive side walls 42, 46, the upper and lower electrically conductive walls (and the barrier to be described below) may be formed as the patterned metal features of a metallisation stack.

As can be seen from FIG. 4, in this example, the side walls 42, 46, the first electrically conductive signal member 2, the second electrically conductive signal member 4 and the barrier (to be described below) in this embodiment may be elongate and may coextend along a longitudinal axis of the RF component 10. As noted above, the first electrically conductive signal member 2 and the second electrically conductive signal member 4 in this embodiment form strip lines. It will be appreciated that the elongate, coextensive arrangement shown in FIG. 4 is not essential, particularly, for example, where the electrically conductive signal members 2, 4 form RF components other than strip lines (e.g. antennae).

In order to provide electromagnetic shielding of the first electrically conductive signal member 2 from the second electrically conductive signal member 4 (and vice versa), the embodiment shown in FIG. 4 is provided with a barrier. The barrier is electrically conductive (e.g. metallic) and is located between the first electrically conductive signal member 2 and the second electrically conductive signal member 4, and between the upper and lower electrically conductive walls (where such walls are included).

The barrier in this embodiment is formed by a plurality of electrically conductive shielding members 44A, 44B. Each electrically conductive shielding member comprises a polyhedron formed from an electrically conductive material (e.g. metal). Similarly, the sidewalls 12, 16 in this embodiment may also be provided as polyhedra formed from an electrically conductive material (e.g. metal), although this is not essential (e.g. vias of the kind shown in FIG. 3 could be used).

In this embodiment, the barrier comprises a first row of electrically conductive shielding members 44A spaced apart along a longitudinal axis of the first row, and a second row of electrically conductive shielding members 44B spaced apart along a longitudinal axis of the second row. In this embodiment, the electrically conductive shielding members 44A of the first row are offset (staggered) with respect to the electrically conductive shielding members 44B of the second row. This can prevent a direct line of sight between the first electrically conductive signal member 2 and the second electrically conductive signal member 4, thereby improving the electromagnetic shielding providing by the barrier. As shown by the arrow labelled "A" in FIG. 4, any electromagnetic radiation passing through the barrier must navigate a plurality of turns or corners in order to reach the other one of the electrically conductive signal members. In this embodiment, the offset is chosen such that a gap located between each electrically conductive shielding member 44A of the first row is located opposite a middle of an electrically conductive shielding member 44B of the second row, although this is not essential and other offsets could also be used.

The use of polyhedra for the electrically conductive shielding members of the barrier has a number of advantages. The use of polyhedra is readily compatible with standard semiconductor manufacturing techniques, such as the formation of metallization stacks. Because of this, a high degree of flexibility is achieved in terms of choosing the shape and size of the electrically conductive shielding members, whereby the shielding provided by the barrier can be optimised.

Each electrically conductive shielding member in each row may be elongate (e.g. as shown in FIG. 4). A longitudinal axis of each electrically conductive shielding member may extend substantially parallel to a longitudinal axis of the barrier itself. Also, a longitudinal axis of each polyhedron in each row may be substantially parallel to a longitudinal axis of that row. The longitudinal axis of the first row may be 44A substantially parallel to the longitudinal axis of the second row 44B.

Note that the arrangement shown in FIG. 4 can prevent any direct line of sight between the electrically conductive signal members 2, 4 (this may be contrasted with the arrow labelled "B" in FIG. 3).

To simplify the manufacturing process, each electrically conductive shielding member in each row 44A, 44B may be the same shape and size. It will be appreciated that at the ends of the barrier, one or more of the electrically conductive shielding members may need to be a different shape, owing to the offset nature of the arrangement of the electrically conductive shielding members in the barrier.

Various shapes for the electrically conductive shielding members 44A, 44B are envisaged. As noted above, each electrically conductive shielding member 44A, 44B comprises a polyhedron, which can simplify the manufacturing process as polyhedra in general are compatible with known metallization techniques in the semiconductor industry. For the purposes of this disclosure, a polyhedron may be considered to be a three-dimensional shape with flat polygonal faces, straight edges and sharp corners or vertices. Note that the vias 24A, 24B do not fall within this definition.

In the embodiment shown in FIG. 4, each polyhedron comprises a rectangular cuboid. The rectangular cuboid may be elongate. For example, the rectangular cuboid may be a square cuboid. The use of a rectangular cuboid provides a simple shape for layout purposes and manufacture, while still allowing the prevention of any direct line of sight between the electrically conductive signal members 2, 4.

As will be described below, more complicated types of polyhedra are envisaged, for enhancing the isolation between the electrically conductive signal members 2, 4.

Figure 5:
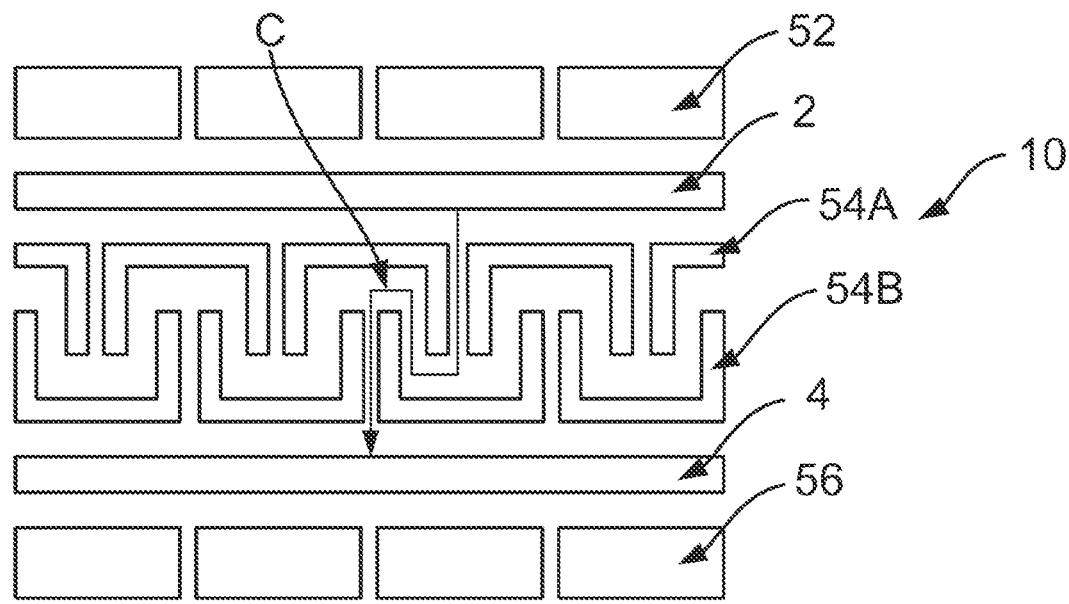
FIG. 5 shows an RF component including two strip lines, according to another embodiment of this disclosure.

FIG. 5 shows an RF component 10 including two strip lines 2, 4, according to another embodiment of this disclosure. In this embodiment, the RF component 10 again comprises a first electrically conductive signal member 2 for conveying an RF signal and a second electrically conductive signal member 4 for conveying an RF signal. In this embodiment, the first and second electrically conductive signal members 2, 4 are transmission lines e.g. strip lines. However, again, it will be appreciated that the electrically conductive signal members 2, 4 could be other kinds of components, such as antennae.

As described above, the first and second electrically conductive signal members 2, 4 in this embodiment may be provided in a laminated structure such as a metallization stack including a plurality of dielectric layers and layers of patterned metal features. The metallization stack may be located on a substrate such as a printed circuit board (PCB) or on a semiconductor substrate such as on the surface of a semiconductor die.

As described above, electrically conductive side walls 52, 56 may be provided at either lateral side of the RF component 10. Similarly, upper and lower electrically conductive walls may be provided above and below the first and second electrically conductive signal members 2, 4, as described above in relation to FIG. 1. Again, each electrically conductive signal member 2, 4 may be located within a respective dielectric region as described above in relation to FIG. 1. The dielectric regions may be enclosed by the electrically conductive side walls 42, 46 and the upper and lower electrically conductive walls. The electrically conductive features, including the electrically conductive signal members 2, 4, the electrically conductive side walls 42, 46, the upper and lower electrically conductive walls (and the barrier to be described below) may be formed as the patterned metal features of a metallisation stack, as described above.

As can be seen from FIG. 5, in this example, the side walls 52, 56, the first electrically conductive signal member 2, the second electrically conductive signal member 4 and the barrier (to be described below) in this embodiment may be elongate and may coextend along a longitudinal axis of the RF component 10. As noted above, the first electrically conductive signal member 2 and the second electrically conductive signal member 4 in this embodiment form strip lines. It will be appreciated that the elongate, coextensive arrangement shown in FIG. 5 is not essential, particularly, for example, where the electrically conductive signal members 2, 4 form RF components other than strip lines (e.g. antennae).

The barrier in this embodiment comprises a first row of electrically conductive shielding members 54A spaced apart along a longitudinal axis of the first row and a second row of electrically conductive shielding members 54B spaced apart along a longitudinal axis of the second row. Each electrically conductive shielding member 54A, 54B comprises a polyhedra.

The polyhedra used for the electrically conductive shielding members 54A, 54B in this embodiment collectively form a labyrinthine structure which, as can be seen from the arrow labelled C in FIG. 5, prevents a direct line of sight between the electrically conductive signal members 2, 4. Moreover, the labyrinthine structure can increase the path length for electromagnetic fields attempting to pass through the barrier and by requiring the fields to navigate multiple (e.g. at least three, four, five or even more) turns within the barrier (again, see the arrow labelled C in FIG. 5). This arrangement can increase the isolation between the electrically conductive signal members 2, 4.

Although various labyrinthine structures may be used, depending on the exact shape chosen for the electrically conductive shielding members 54A, 54B, in this embodiment, each electrically conductive shielding member 54A of the first row comprises a base portion having a first end and a second end, a first arm extending from the first end of the base towards the second row, and a second arm extending from the second end of the base towards the second row. Similarly, each electrically conductive shielding member of the second row comprises a base portion having a first end and a second end, a first arm extending from the first end of the base towards the first row, and a second arm extending from the second end of the base towards the first row. The polyhedra of the electrically conductive shielding members 54A, 54B are thus substantially "U" shaped.

To complete the labyrinthine structure of the present embodiment, the arms of the U-shaped electrically conductive shielding members 54A, 54B are interlocked, that is to say that a distal end of each arm of each electrically conductive shielding member 54A of the first row is located within a region located between the arms of an electrically conductive shielding member 54B of the second row (and vice versa). This interlocking of the arms of the electrically conductive shielding members 54A, 54B can, as demonstrated by the arrow labelled C in FIG. 5, increase the number of turns that electromagnetic fields attempting to pass through the barrier must navigate.

In the embodiments described above in relation to FIGS. 4 and 5, the barrier includes two rows of electrically conductive shielding members 54A, 54B. However, it is envisaged that the barrier may have more than two (three, four, five, etc.) rows of electrically conductive shielding members 54A, 54B. The electrically conductive shielding members 54A, 54B of the additional rows may also comprise a polyhedra.

The provision of any additional rows of electrically conductive shielding members 54A, 54B in the barrier can further improve the isolation between the electrically conductive signal members 2, 4. For instance, the additional rows may be used to increase the path length for any electromagnetic fields attempting to pass through the barrier by introducing yet further turns that the electromagnetic fields must navigate.

Figure 6:
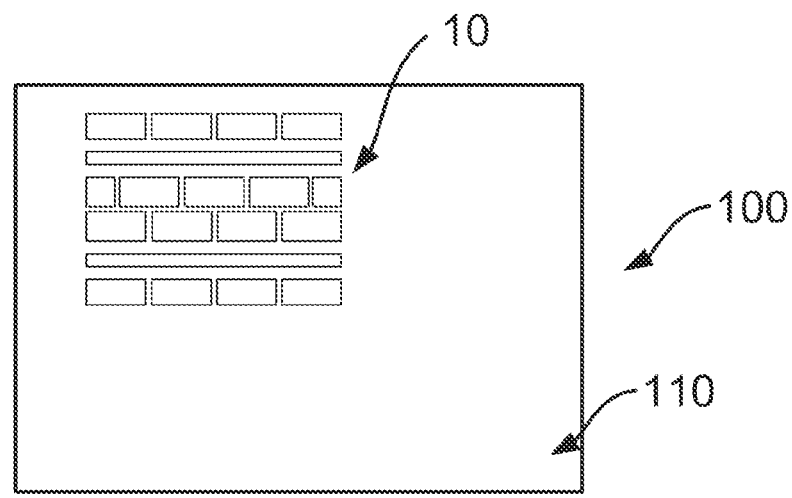
FIG. 6 shows a semiconductor device according to a further embodiment of this disclosure.

FIG. 6 shows a semiconductor device 100 according to a further embodiment of this disclosure. The device 100 in this embodiment comprises a package 110. The package contains an RF component 10 of the kind described herein.

Figure 7:
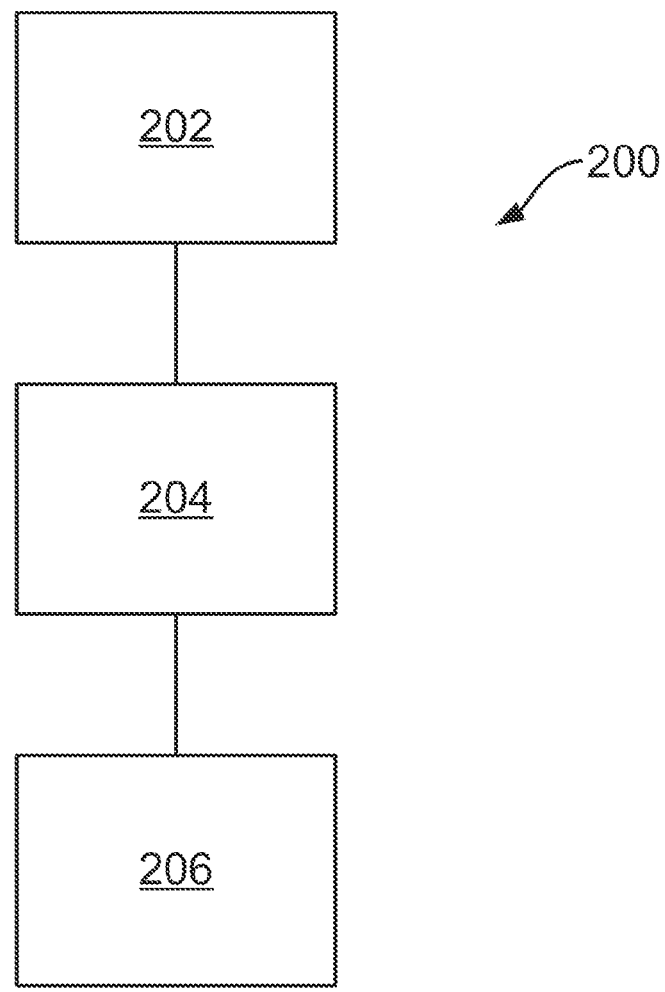
FIG. 7 shows a method of making a Radio Frequency, "RF", component according to another embodiment of this disclosure.

FIG. 7 shows a method 200 of making a Radio Frequency, "RF", component 10 of the kind described herein, according to another embodiment of this disclosure.

In a first step 202, a first electrically conductive signal member 2 for conveying an RF signal is formed. The first electrically conductive signal member 2 may be of the kind described above in relation to FIGS. 4 to 6.

In a second step 204, a second electrically conductive signal member 4 for conveying an RF signal is formed. The second electrically conductive signal member 4 may be of the kind described above in relation to FIGS. 4 to 6.

In a third step 206, a barrier located between the first electrically conductive signal member and the second electrically conductive signal member is formed. The barrier is for electromagnetically shielding the first and second electrically conductive signal members from each other. The barrier may be of the kind described above in relation to FIGS. 4 to 6.

The steps 202, 204, 206 may include deposit and patterning a plurality of layers of electrically conductive material and deposit and patterning a plurality layers of dielectric on a surface. As described herein, the layers may build up to form a metallization stack. The surface upon which the stack is formed may, for example, be the surface of a substrate such as a printed circuit board (PCB) or the surface of a semiconductor substrate such as a semiconductor die. Although FIG. 7 presents the formation of the electrically conductive signal members 2, 4 and the barrier in separate steps in which the electrically conductive signal members 2, 4 are formed first, it will be appreciated that these features could be formed in a different order (e.g. the barrier could be formed before the electrically conductive signal members 2, 4). It is also envisaged that these features could be formed simultaneously, that is to say in the same step.

Accordingly, there has been described a Radio Frequency, "RF", component and a method of making the same. The component comprises a first electrically conductive signal member for conveying an RF signal and a second electrically conductive signal member for conveying an RF signal. The component also comprises a barrier located between the first signal member and the second signal member electromagnetically to shield the first and second signal members from each other. The barrier comprises a first row of electrically conductive shielding members spaced apart along a longitudinal axis of the first row, and a second row of electrically conductive shielding members spaced apart along a longitudinal axis of the second row. Each shielding member comprises a polyhedron. The shielding members of the first row are offset with respect to the shielding members of the second row to prevent a direct line of sight between the first signal member and the second signal member.

Although particular embodiments of this disclosure have been described, it will be appreciated that many modifications/additions and/or substitutions may be made within the scope of the claims.

The invention claimed is:

1. A Radio Frequency, "RF", component comprising:
 a first electrically conductive signal member for conveying an RF signal;
 a second electrically conductive signal member for conveying an RF signal; and
 a barrier located between the first electrically conductive signal member and the second electrically conductive signal member electromagnetically to shield the first and second electrically conductive signal members from each other, wherein the barrier comprises:
 a first row of electrically conductive shielding members spaced apart along a longitudinal axis of the first row, wherein each electrically conductive shielding member in the first row comprises a polyhedron; and
 a second row of electrically conductive shielding members spaced apart along a longitudinal axis of the second row, wherein each electrically conductive shielding member in the second row comprises a polyhedron; and
 wherein the electrically conductive shielding members of the first row are offset with respect to the electrically conductive shielding members of the second row to prevent a direct line of sight between the first electrically conductive signal member and the second electrically conductive signal member.

2. The RF component of claim 1, wherein each electrically conductive shielding member in each row is elongate.

3. The RF component of claim 2, wherein a longitudinal axis of each polyhedron in each row is substantially parallel to the longitudinal axis of that row.

4. The RF component of claim 3, wherein the longitudinal axis of the first row is substantially parallel to the longitudinal axis of the second row.

5. The RF component of claim 2, wherein each electrically conductive shielding member in each row is the same shape and size.

6. The RF component of claim 2, wherein the electrically conductive shielding members of the first row are offset with respect to the electrically conductive shielding members of the second row such that a gap located between each electrically conductive shielding member of the first row is located opposite a middle of an electrically conductive shielding member of the second row.

7. The RF component of claim 2, wherein the first electrically conductive signal member and/or the second electrically conductive signal member comprise an antenna.

8. The RF component of claim 1, wherein each electrically conductive shielding member in each row is the same shape and size.

9. The RF component of claim 1, wherein the electrically conductive shielding members of the first row are offset with respect to the electrically conductive shielding members of the second row such that a gap located between each electrically conductive shielding member of the first row is located opposite a middle of an electrically conductive shielding member of the second row.

10. The RF component of claim 1, wherein each electrically conductive shielding member in each row comprises a rectangular cuboid.

11. The RF component of claim 1, wherein the electrically conductive shielding members of the rows of the barrier collectively form a labyrinthine structure.

12. The RF component of claim 11, wherein:
each electrically conductive shielding member of the first row comprises:
- a base portion having a first end and a second end;
- a first arm extending from the first end of the base towards the second row; and
- a second arm extending from the second end of the base towards the second row;

each electrically conductive shielding member of the second row comprises:
- a base portion having a first end and a second end;
- a first arm extending from the first end of the base towards the first row; and
- a second arm extending from the second end of the base towards the first row.

13. The RF component of claim 12, wherein a distal end of each arm of each electrically conductive shielding member of the first row is located within a region located between the arms of an electrically conductive shielding member of the second row.

14. The RF component of claim 11, wherein the barrier comprises at least one further row of electrically conductive shielding members spaced apart along a longitudinal axis of that further row, wherein each electrically conductive shielding member in the or each further row comprises a polyhedron.

15. The RF component of claim 11, wherein the first electrically conductive signal member and/or the second electrically conductive signal member comprise a transmission line.

16. The RF component of claim 1, wherein the barrier comprises at least one further row of electrically conductive shielding members spaced apart along a longitudinal axis of that further row, wherein each electrically conductive shielding member in the or each further row comprises a polyhedron.

17. The RF component of claim 1, wherein the first electrically conductive signal member and/or the second electrically conductive signal member comprise a transmission line.

18. The RF component of claim 1, wherein the first electrically conductive signal member and/or the second electrically conductive signal member comprise an antenna.

19. A semiconductor device comprising a package containing an RF component according to claim 1.

20. A method of making a Radio Frequency, "RF", component, the method comprising forming:
- a first electrically conductive signal member for conveying an RF signal;
- a second electrically conductive signal member for conveying an RF signal; and
- a barrier located between the first electrically conductive signal member and the second electrically conductive signal member electromagnetically to shield the first and second electrically conductive signal members from each other, wherein the barrier comprises:
  - a first row of electrically conductive shielding members spaced apart along a longitudinal axis of the first row, wherein each electrically conductive shielding member in the first row comprises a polyhedron; and
  - a second row of electrically conductive shielding members spaced apart along a longitudinal axis of the second row, wherein each electrically conductive shielding member in the second row comprises a polyhedron; and
wherein the electrically conductive shielding members of the first row are offset with respect to the electrically conductive shielding members of the second row to prevent a direct line of sight between the first electrically conductive signal member and the second electrically conductive signal member.

* * * * *